(12) United States Patent
Sheng et al.

(10) Patent No.: US 7,932,845 B2
(45) Date of Patent: Apr. 26, 2011

(54) PILOT-TONE CALIBRATION FOR TIME-INTERLEAVED ANALOG-TO-DIGITAL CONVERTERS

(75) Inventors: Samuel Sheng, Los Gatos, CA (US); Weijie Yun, San Jose, CA (US)

(73) Assignee: Telegent Systems, Inc., Grand Cayman (KY)

( * ) Notice: Subject to any disclaimer, the term of this patent is extended or adjusted under 35 U.S.C. 154(b) by 0 days.

(21) Appl. No.: 12/691,518

(22) Filed: Jan. 21, 2010

(65) Prior Publication Data

US 2010/0117878 A1    May 13, 2010

Related U.S. Application Data

(60) Division of application No. 11/871,953, filed on Oct. 12, 2007, now Pat. No. 7,675,441, which is a continuation of application No. 11/232,580, filed on Sep. 21, 2005, now Pat. No. 7,283,074, which is a continuation-in-part of application No. 11/120,439, filed on May 2, 2005, now abandoned.

(60) Provisional application No. 60/612,109, filed on Sep. 21, 2004.

(51) Int. Cl.
H03M 1/10 (2006.01)
(52) U.S. Cl. ....................................... 341/120; 341/155
(58) Field of Classification Search .................. 341/120, 341/118, 144, 155, 111, 159; 455/126; 375/345, 375/155, 126
See application file for complete search history.

(56) References Cited

U.S. PATENT DOCUMENTS

| | | | |
|---|---|---|---|
| 4,612,533 A | 9/1986 | Evans | |
| 4,763,105 A | 8/1988 | Jenq | |
| 6,384,756 B1 | 5/2002 | Tajiri et al. | |
| 6,414,612 B1 | 7/2002 | Quesenberry | |
| 6,522,282 B1 | 2/2003 | Elbornsson | |
| 6,553,066 B1 | 4/2003 | Pollet et al. | |
| 6,701,297 B2 | 3/2004 | Main | |
| 6,801,145 B2 | 10/2004 | Asami | |
| 7,049,984 B2 | 5/2006 | Wood et al. | |
| 7,084,793 B2 | 8/2006 | Elbornsson | |
| 7,336,729 B2 | 2/2008 | Agazzi | |
| 7,408,495 B2 | 8/2008 | Stein et al. | |
| 7,425,908 B2 | 9/2008 | Gremillet | |
| 2002/0007386 A1 | 1/2002 | Martin et al. | |

(Continued)

FOREIGN PATENT DOCUMENTS
WO       WO02/07399       1/2002

OTHER PUBLICATIONS

International Search Report and Written Opinion of the International Searching Authority in International Application PCT/US2005/034022, European Patent Office, Feb. 13, 2006, 13 pages.

(Continued)

*Primary Examiner* — Peguy JeanPierre

(57) ABSTRACT

A self-calibrating analog-to-digital converter (ADC). The ADC includes multiple component ADCs to generate respective digital representations of an input signal in response to respective timing signals that are offset in phase from one another, each component ADC having a gain setting that controls a magnitude of the digital representations. The ADC further includes correction circuitry to generate a plurality of fast-Fourier transforms (FFTs) that correspond to the digital representations of the input signal and to adjust the gain settings of the component ADCs and/or phase angles of the timing signals based on gain and phase errors indicated by the FFTs.

26 Claims, 3 Drawing Sheets

U.S. PATENT DOCUMENTS

| | | |
|---|---|---|
| 2002/0106009 A1 | 8/2002 | Harrison |
| 2003/0076899 A1 | 4/2003 | Kumar et al. |
| 2003/0118127 A1 | 6/2003 | Peting |
| 2003/0231726 A1 | 12/2003 | Schuchert et al. |
| 2004/0082300 A1 | 4/2004 | Scheck |
| 2005/0071403 A1 | 3/2005 | Tauntion |

OTHER PUBLICATIONS

International Search Report of the International Searching Authority in International Application PCT/US2005/015159, European Patent Office, Apr. 5, 2007, 3 pages.

Younis, A. et al. "A Calibration Algorithm for a 16-bit Multi-path Pipeline ADC", Circuits and Systems, 2000, Proceedings of the 43rd IEEE Midwest Symposium on Aug. 8-11, 2000, Lansing, MI, USA, IEEE, vol. 1, Aug. 8, 2000 pp. 158-161.

PILOT-TONE CALIBRATION FOR TIME-INTERLEAVED ANALOG-TO-DIGITAL CONVERTERS

CROSS-REFERENCE TO RELATED APPLICATIONS

This application is a division of U.S. application Ser. No. 11/871,953 filed Oct. 12, 2007 now U.S. Pat. No. 7,675,441, which is a continuation of U.S. patent application Ser. No. 11/232,580 filed Sep. 21, 2005 (now U.S. Pat. No. 7,283,074), which is a continuation-in-part of U.S. patent application Ser. No. 11/120,439 filed May 2, 2005 now abandoned. This application, application Ser. No. 11/871,953 and application Ser. No. 11/232,580 claim priority from U.S. Provisional Application No. 60/612,109 filed Sep. 21, 2004. U.S. Pat. No. 7,283,074 and U.S. Provisional Application 60/612,109 are hereby incorporated by reference.

TECHNICAL FIELD

The present invention relates to analog to digital conversion.

BACKGROUND

To meet the ever-present demand for increased speed and accuracy in analog-to-digital converters (ADCs), techniques such as time-interleaving have become increasingly popular. Referring to FIG. 1, in a time-interleaved ADC 90, multiple component ADCs or sub-ADCs $91_1$-$91_N$ are provided to perform analog-to-digital conversion operations in response to a set of phase-staggered clock signals 94. By this operation, multiple analog-to-digital conversions are pipelined, with the outputs of the sub-ADCs 91 becoming valid one after another on an output line 96. Thus, where a single sub-ADC 91 may be capable of providing an M-bit digital representation of the input signal once per clock cycle, the aggregate operation of time-interleaved sub-ADCs $91_1$-$91_N$ provides N such digital representations of the input signal per clock cycle and thus N-times faster ADC operation.

Gain mismatch in sub-ADCs 91 and timing offsets in the clock signals 94 used to trigger time-interleaved conversion operations can limit the performance of a time-interleaved ADC, even if the slower sub-ADCs are of sufficient accuracy. Thus, techniques for eliminating or minimizing such gain mismatches and timing offsets can be critical.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Self-calibrating analog-to-digital conversion devices and systems are disclosed herein in various embodiments. In one embodiment, a predetermined-frequency sine wave, referred to herein as a pilot tone, is added to a signal of interest as a calibration reference. The resulting composite signal is input to a time-interleaved ADC having multiple component ADCs (or sub-ADCs) that are triggered by a phase-staggered set of timing signals to generate respective digital samples of the input signal. Each of the digital samples is transformed to a frequency-domain representation in a fast-Fourier transform (FFT) operation performed on the output of each component ADC so that, for N component ADCs, as many as N FFT operations are performed. The transforms or FFTs that result from the FFT operations are supplied to correction logic which evaluates the relative amplitudes and phases of spectral components of the portion of the transforms that correspond to the pilot tone (i.e., the pilot transforms). Because the amplitudes of the pilot transforms should match one another (i.e., because the FFT operations are performed on time-offset samples of the same pilot sinusoid), any differences between the pilot transform amplitudes are deemed to result from gain mismatch in the component ADCs and thus may be used to adjust the gains of the component ADCs as necessary to establish equal or substantially equal gains. Similarly, because the phases of the pilot transforms should be equally offset from one another within a cycle time of the timing signals (e.g., the timing signals oscillate at the same frequency in one embodiment and therefore share the same cycle time, but have different phase offsets within the cycle time), pilot transforms exhibiting phase offsets that deviate from their expected phase angles are deemed to result from phase error in one or more of the timing signals. Accordingly, such phase deviations may be used to adjust the phase of the timing signals as necessary to correct the phase errors and thus establish a desired distribution of phase offsets in the pilot transforms.

Figure 1:
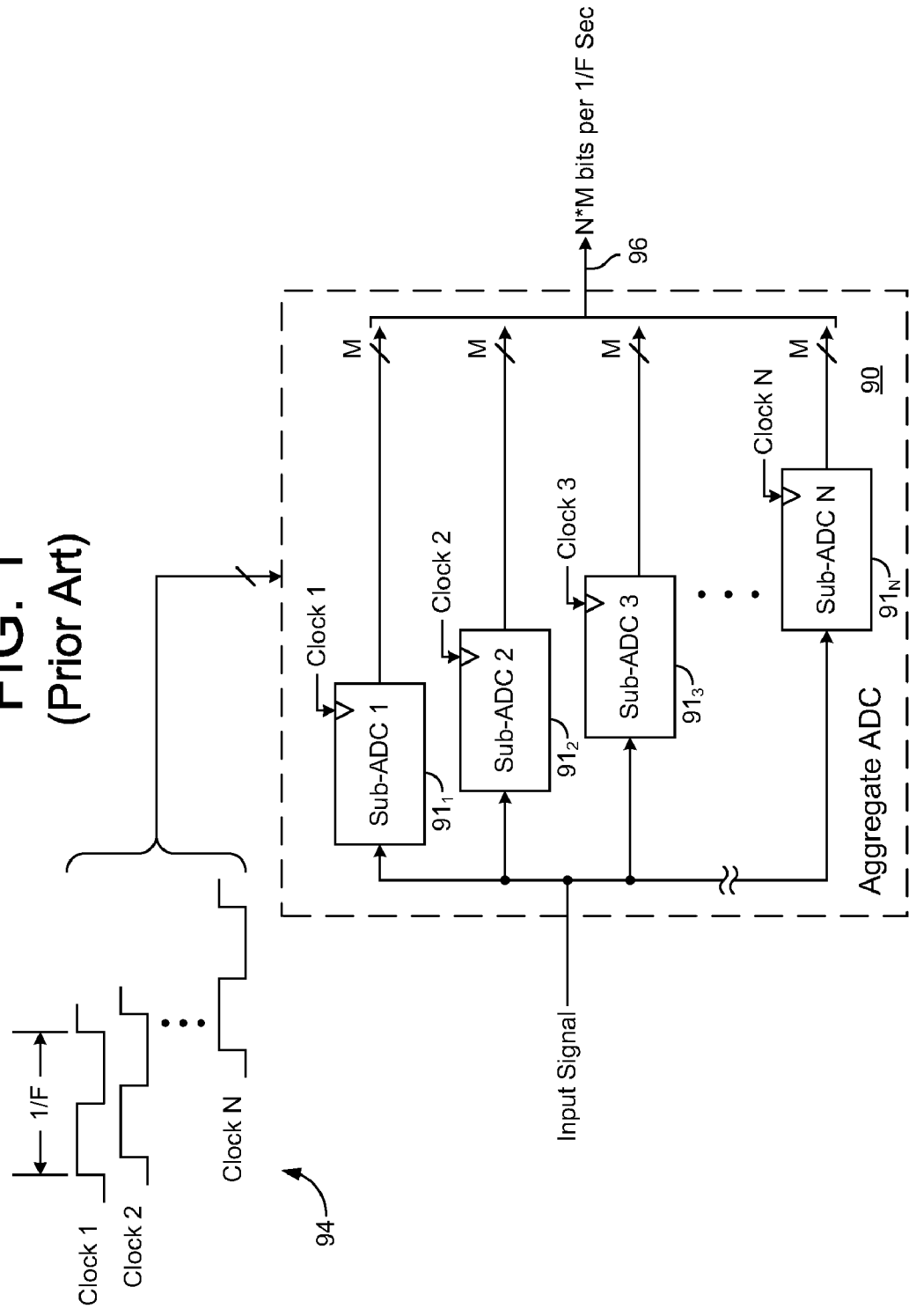
FIG. 1 illustrates a prior-art time-interleaved analog-to-digital converter arrangement.
Figure 2:
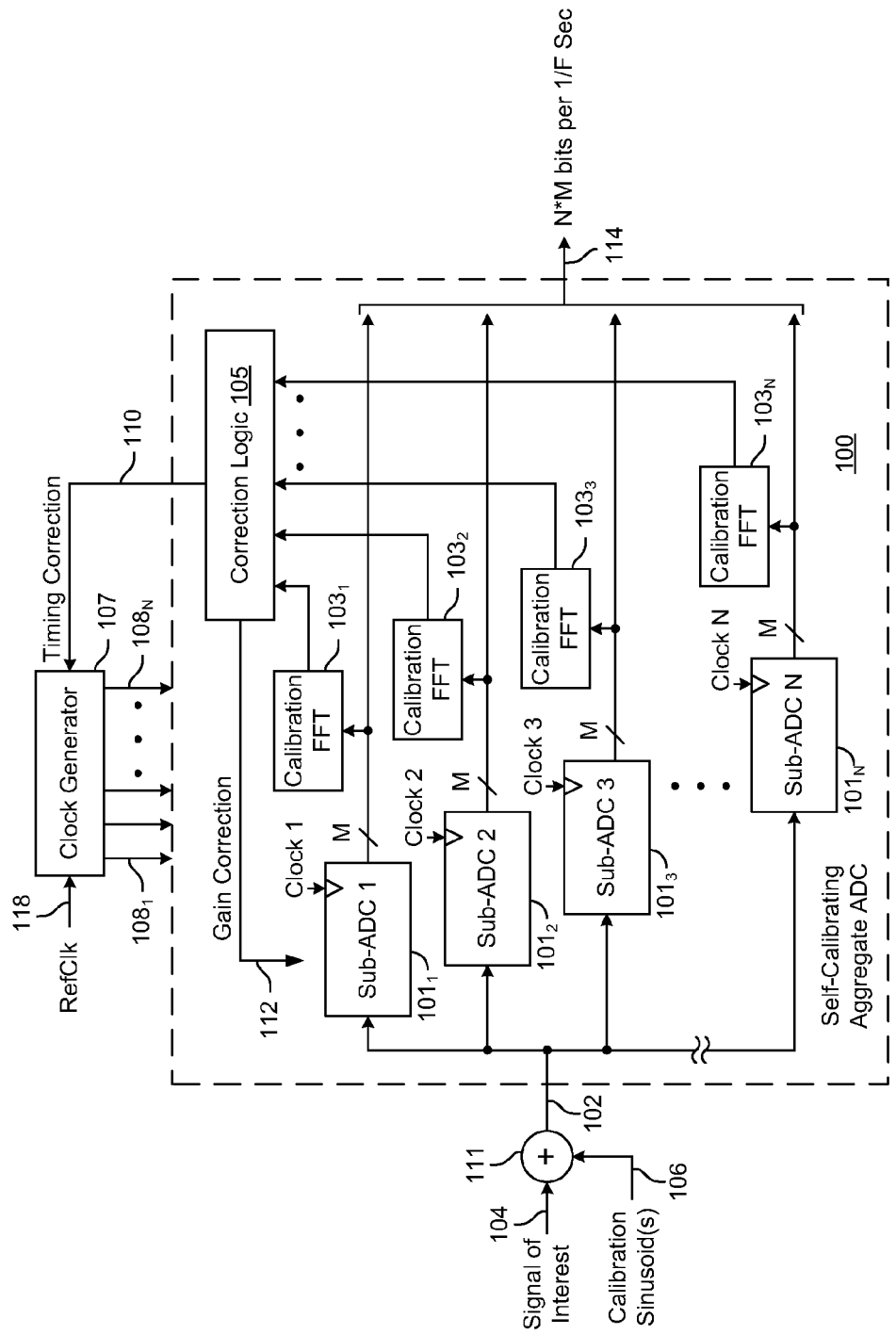
FIG. 2 illustrates an embodiment of a self-calibrating time-interleaved analog-to-digital converter.

FIG. 2 illustrates an embodiment of a self-calibrating time-interleaved analog-to-digital converter 100 having multiple component ADCs $101_1$-$101_N$ (also referred to as sub-ADCs) to sample an input signal 102 in response to respective sampling clock signals $108_1$-$108_N$. The sampling clock signals 108 are generated by a clock generator 107 (e.g., a delay-locked loop, phase-locked loop or other clock generating circuit) and are offset in phase from one another so as to trigger analog-to-digital conversion operations within each of component ADCs 101 one after another in time-staggered fashion. By this operation, each of the component ADCs 101 outputs a respective digital representation or digital sample of the input signal onto output path 114 one after another over a cycle time of a given sampling clock signal (all sampling clock signals having the same or substantially the same period, but different phase offsets). From the standpoint of a downstream device, the component ADCs $101_1$-$101_N$ operate as an aggregate ADC to deliver a new M-bit sample of the input signal 102 N times per sampling clock cycle.

In one embodiment, a summing circuit 111 (which may be a simple wired summation) is provided to generate the input signal 102 by summing a signal of interest 104 with one or more sinusoidal signals of predetermined frequency, referred to herein as pilot tones or pilot signals 106. The pilot signals 106 may be generated either externally or by circuitry disposed on the same integrated circuit die (or within the same integrated circuit package) as the time-interleaved ADC 100 and, at least in one embodiment, are harmonically related to the sampling clock frequency.

The outputs of the component ADCs $101_1$-$101_N$ are supplied to a fast-Fourier transform (FFT) engine, illustrated in FIG. 2 as a bank of calibration FFT units $103_1$-$103_N$. The FFT engine (collectively, 103) generates an FFT for each component ADC 101 and supplies the set of transforms (FFTs) to correction logic 105. Each of the FFTs supplied to the correction logic 105 constitutes a measure of both the gain of the component ADCs 101 and the timing offsets of the corresponding sampling clock signals 108. Because the pilot signal 106 is sinusoidal, the spectral component of each FFT that results from transformation of the pilot signal (i.e., the pilot transform) will ideally have the same amplitude as the pilot transform conveyed in all the other FFTs. Thus, any deviation between amplitudes of the pilot transforms indicates a gain mismatch between the component ADCs 101 that may be corrected by operation of the correction logic 105. Similarly, because the pilot transforms have been obtained by transformation of phase-delayed samples of the same sinusoid (or sinusoids), the pilot transforms will ideally have respective phase values that correspond the relative timing offsets between the corresponding sampling clock signals 108. For example, if there are eight component ADCs 101, and the pilot signal is at one-eighth ($\frac{1}{8}^{th}$) the aggregate sampling clock frequency, the phase measures of the pilot transforms within the FFTs for component ADCs $101_1$-$101_8$ should be 0, $\pi/4$, $\pi/2$, $3\pi/4$, $\pi$, $5\pi/4$, $3\pi/2$ and $7\pi/4$, respectively. Any deviation from these phase measures indicates a mismatch in the relative sampling times of the component ADCs 101 that may be corrected by the correction logic 105.

In one embodiment, the FFT engine 103 and correction logic 105 is implemented at least in part by a programmed processor which may be, for example and without limitation, a digital signal processor (DSP) or general purpose processor. In alternative embodiments, the FFT engine and/or correction logic or any portion thereof may be implemented by a state machine or hardwired circuitry, including circuitry specifically designed to carry out the phase and gain correction operations described herein.

Figure 3:
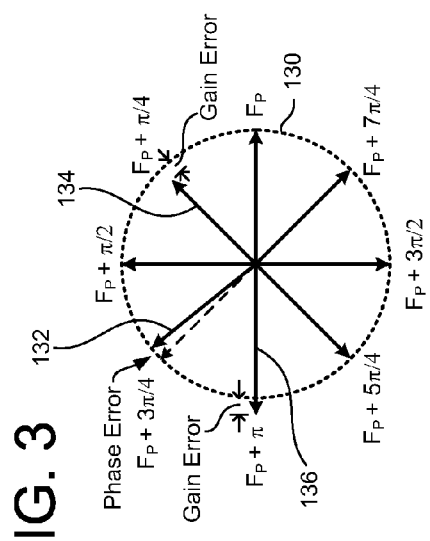
FIG. 3 is a graphical illustration of the output of the FFT bank of FIG. 2 in a system having eight component analog-to-digital converters.

FIG. 3 is a graphical illustration of the output of the FFT bank 103 in a system having eight component ADCs 101 that are triggered by sampling clocks 108 spaced apart by nominal $\pi/4$ (45°) phase increments and that have a nominal gain that corresponds to amplitude 130 (illustrated as a ring) in the pilot transforms. Choosing the phase angle indicated by the pilot transform for component ADC $101_1$ as a 0° reference (i.e., $F_P$+0, where $F_P$ is the pilot frequency), the phase angles for the pilot transforms should ideally fall at angles $\pi/4$, $\pi/2$, $3\pi/4$, $\pi$, $5\pi/4$, $3\pi/2$ and $7\pi/4$. Thus, assuming the phase angle for the pilot transform that corresponds to component ADC $101_4$ (i.e., indicated by reference number 132 in FIG. 3) is advanced relative to the desired phase angle as shown, such deviation from the desired phase angle represents a phase error that may be corrected by delaying the corresponding sampling clock signal (i.e., clock signal $108_4$). Similarly, because the amplitudes of the pilot transforms that correspond to component ADCs $101_2$ and $101_5$ (i.e., the pilot transforms indicated by reference number 134 and 136 in FIG. 3) do not match the nominal amplitude 130, such amplitude deviations represent gain errors that may be corrected by increasing the gain of component ADC $101_2$ and decreasing the gain of component ADC $101_5$.

Figure 5:
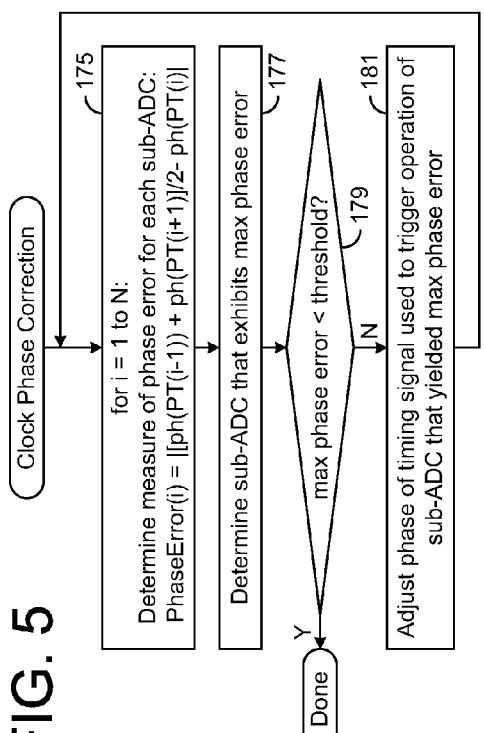
FIG. 5 illustrates an exemplary clock phase correction operation that may be performed by the correction logic within the analog-to-digital converter of FIG. 2.
Figure 4:
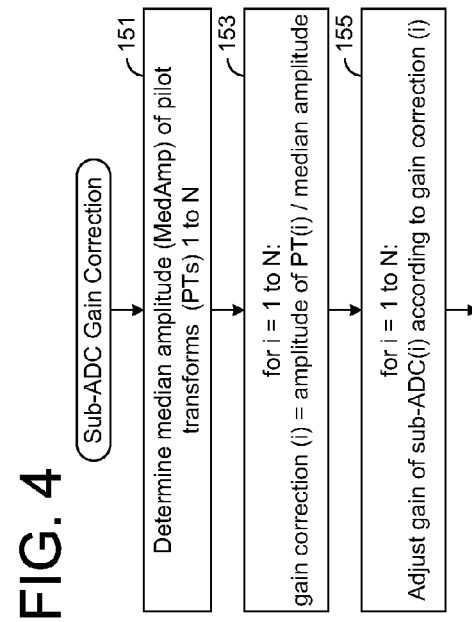
FIG. 4 illustrates an exemplary gain correction operation that may be performed by the correction logic within the analog-to-digital converter of FIG. 2.

FIGS. 4 and 5 illustrate exemplary ADC gain correction operations and clock phase correction operations that may be performed by the correction logic 105 of FIG. 2. Referring first to the gain correction operation of FIG. 4, at 151, the median amplitude of the N pilot transforms is determined. Then, at 153, a gain correction factor is determined for each of component ADCs $101_1$-$101_N$ as a ratio of the median amplitude to the amplitude of the corresponding pilot transform. Thus, in the exemplary set of pilot transforms illustrated in FIG. 3, the median amplitude corresponds to the amplitude shown at 130, so that the gain correction factor for component ADC $101_2$ will be a value greater than one (because the corresponding pilot tone amplitude is less than the median amplitude) and the gain correction factor for component ADC $101_5$ will be a value less than one. At 155, the gain of each component ADC is adjusted according to the corresponding gain correction factor. This gain adjustment may be effected either through modification of the analog gain of the component ADC, or as a digital scaling operation (e.g., digital multiplication) after the analog-to-digital conversion is completed. For example, in one embodiment, the gain setting of each component ADC is recorded within the correction logic 105 as a numerical value that is multiplied by the gain correction factor to achieve an updated gain setting. Thus, multiplying the gain setting for component ADC $101_2$ by a value greater than one yields an increased gain setting, and multiplying the gain setting for component ADC $101_5$ by a value less than one yields a reduced gain setting. The gain adjustment is completed by outputting the updated gain settings to the component ADCs.

Numerous changes may be made to the gain correction approach of FIG. 4 in alternative embodiments. For example, gain errors smaller than a predetermined or programmable threshold may be ignored, thus establishing a correction deadband and avoiding undue dither in the gains of the component ADCs. Also, gain settings may be limited by upper or lower thresholds to ensure gain settings within a desired range. Further, instead of determining a median amplitude, a mean amplitude, mode amplitude (i.e., most commonly occurring amplitude) or amplitude that yields gain settings most centered between maximum and minimum limits may determined and used to generate gain correction factors. Also, instead of applying gain correction factors to generate updated gain settings, gain settings may be incremented or decremented by a predetermined or programmable stepsize according to whether the amplitude of the corresponding pilot transform is greater than or less than the desired amplitude. More generally, any technique for adjusting the gains of the component ADCs based on the relative amplitudes of the pilot transforms may be used without departing from the spirit and scope of the present invention.

Turning to the clock phase correction operation of FIG. 5, at 175 the phase error for each component ADC may be determined, for example, by determining the difference between the phase angle of the corresponding pilot transform and a phase angle that is midway between the phase angles of the neighboring pilot transforms (e.g., PhaseError(i)=|[ph(PT(i−1)+ph(PT(i+1)]/2−ph(PT(i))|, where 'i' is the index of the component ADC for which the phase error is being calculated, PT(index) is the pilot transform the for the component ADC indicated by the index, ph(PT) is the phase angle of the pilot transform, and '| |' denotes absolute value). Note that the notation 'i+1' and 'i−1' contemplates modulo arithmetic in which the computed index overflows and underflows upon reaching a maximum or minimum value. At 177, a maximum phase error is identified from among the phase errors determined at 175. At 179, the maximum phase error is compared with a predetermined threshold which may be, for example, a programmed setting within a configuration register of the aggregate ADC or host integrated circuit device. If the maximum phase error does not exceed the threshold, then no corrective action is taken and the phase correction operation is concluded. If the maximum phase error does exceed the threshold, then the sampling time of the component ADC that yielded the maximum phase error is adjusted, for example, by advancing or delaying the phase of the timing signal used to trigger operation of the component ADC. In one embodiment, the magnitude of the phase correction is determined according to the magnitude of the phase error and the direction of the phase correction is determined according to whether the phase of the pilot transform leads or lags the phase angle that is midway between the phase angles of the neighboring pilot transforms.

The clock phase correction operation described in reference to FIG. 5 may be changed in a number of ways in alternative embodiments. For example, the measure of phase error for each component ADC may be determined using any approach that identifies a deviation from a desired phase angle. In one alternative embodiment, for instance, the phase angle of the pilot transform for the first component ADC (or any other of the component ADCs) is selected as a base reference, with the phase angles of subsequent pilot transforms being adjusted based on their relative phase offsets from the base reference given the frequency relationship between the sampling clock and the pilot signal. Such a determination may be expressed, for example, as:

PhaseError($i$)=|ph(PTT($i$)−(ExpectedPhase($i$)−ph(PT(1))|, where

ExpectedPhase($i$)=($i$−1)*2π/N.

Also, the threshold comparison at decision block 179 may be omitted so that, instead of the deadband effect provided by the threshold comparison, a phase correction is performed in each iteration of the phase correction operation. Further, in alternative embodiments, the phase of a given timing signal may be adjusted by incrementing or decrementing a phase correction value by a predetermined or programmed stepsize. Also, instead of adjusting the phase angles of the sampling clock signals, a sampling delay within the component ADCs themselves may be increased or decreased. More generally, any technique for adjusting the phase of the sampling times within the component ADCs based on the relative phase angles of the pilot transforms may be used without departing from the spirit and scope of the present invention.

Figure 6:
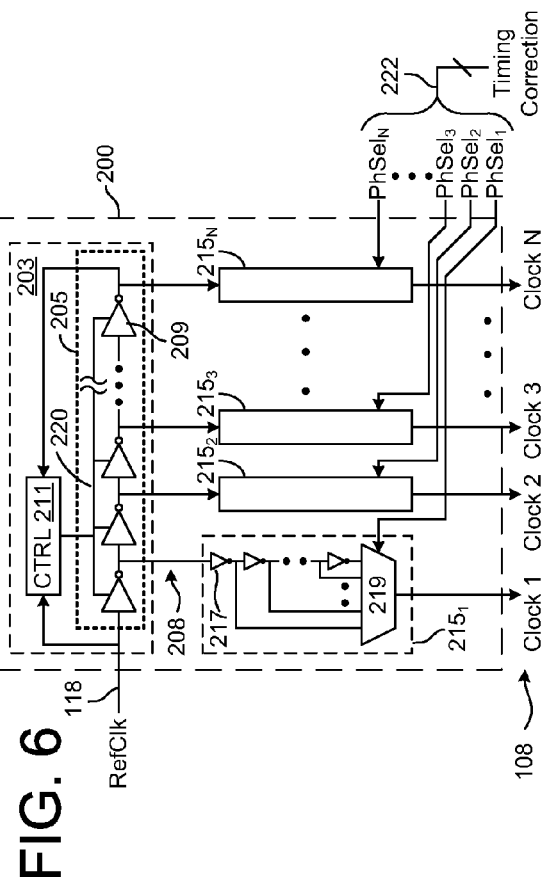
FIG. 6 illustrates an embodiment of a timing circuit that may be used to implement the clock generator of FIG. 2.

FIG. 6 illustrates an embodiment of a timing circuit 200 that may be used to implement the clock generator 107 of FIG. 2. The timing circuit includes a delay-locked loop 203 formed by a delay line 205 and a control circuit 211. A reference clock signal 118 is supplied to the delay line 205 which includes a series of daisy-chained inverters 209 to generate incrementally phase-delayed instances of the reference clock signal 118. The reference clock signal 118 and the output of a final inverter in the delay line 205 (the delay line output) are supplied to the control circuit 211 which adjusts the slew rate through the component inverters 209 of the delay line 205 as necessary to establish phase alignment between the reference clock signal 118 and the delay line output. By this operation, each of the delay-line inverters 209 yields an incrementally phase-delayed version of the clock signal, with the total set of phase-delayed clock signals 208 ideally being evenly distributed in phased through a cycle of the reference clock signal 118. The phase-delayed clock signals 208 output from the delay line 205 are supplied to respective phase selection circuits $215_1$-$215_N$ which each include a series coupled set of delay elements 217 (inverters in this example, though any delay elements may be used) and a multiplexer 219. As shown in the detail view of phase selection circuit $215_1$, the output of each delay element 217 (which is incrementally delayed relative to the input to the delay element) is provided to a respective input port of the multiplexer 219 to provide a set of clock signals that exhibit incrementally increased phase angles. Phase selection values (PhSel$_1$-PhSel$_N$) supplied in the form of timing correction information 222 from the correction logic of the self-calibrating ADC are routed respectively to the phase selection circuits $215_1$-$215_N$ and applied to the control input of the multiplexer 219 therein. By this arrangement, the correction logic (e.g., element 105 of FIG. 2) may change the phase selection value supplied to a given phase selection circuit 215 to advance or delay the phase of the corresponding sampling clock signal. In one embodiment, the phase selection values are initially set to a midpoint value to select a set of sampling clock signals that exhibit phase angles that fall midway within the overall phase selection range of each phase selection circuit 215, thus providing headroom for advancing or delaying the phase of the sampling clock signals as necessary to achieve a desired phase angle.

Alternative clock generating circuits may be used to implement the clock generator 107 of FIG. 2 in alternative embodiments. For example, a phase-locked loop may be provided to generate a set of sampling clock signals that are frequency multiples of the reference clock signal. Also, because calibration circuitry is provided in the form of the phase selection circuits 215, the control circuit 211 may be omitted and the delay line 205 permitted to operate in open-loop fashion. Further, the phase selection circuits 215 may be implemented by phase mixers or any other circuitry capable of generating a timing signal with a controlled phase angle.

It should be noted that the pilot tones and their associated transforms can be used to support self-calibration within a time-interleaved ADC in a number of ways. For example, in applications where injecting a pilot tone might corrupt the signal, the pilot tone can be turned on to support self-calibration when the ADC is powered up, and then shut down or otherwise disabled from reaching the ADC input after the self-calibration is completed. Alternatively, in applications where continuous presence of the pilot tone can be tolerated, the pilot can be continuously supplied in the input signal, allowing the ADC to continuously self-calibrate and thus apply gain and timing signal corrections as necessary to avoid drift (e.g., as may result from changes in voltage and temperature). Such continuous self-calibration operation is particularly well-suited to frequency-division systems such as OFDM (orthogonal frequency division multiplexing), cellular, radio and television. Furthermore, the self-calibration techniques described above may be applied in combination with other calibration schemes, such as the use of background pseudo-noise calibration signals and static capacitor ratio calibrations.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, nonvolatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. The term "exemplary" is used to express an example, not a preference or requirement.

While the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. An integrated circuit device comprising:
   a plurality of analog to digital converter (ADC) circuits to generate respective digital representations of an input signal in response to respective timing signals that are offset in phase from one another, each ADC circuit having a gain setting that controls a magnitude of the digital representations;
   a timing signal generator to generate the timing signals;
   a calibration signal generator to generate a calibration signal that constitutes at least part of the input signal during at least part of a time interval over which the ADC circuits are enabled to generate respective digital representations of the input signal; and
   correction circuitry to generate a plurality of fast-Fourier transforms (FFTs) that correspond to the digital representations of the input signal, the correction circuitry to adjust the gain settings of the ADC circuits and phases of the timing signals generated by the timing signal generator based at least in part on the FFTs.

2. The integrated circuit device of claim 1 wherein the calibration signal is provided to the ADC circuits when the integrated circuit device is initially powered on.

3. The integrated circuit device of claim 2 wherein the calibration signal is disabled from reaching the ADC circuits after the gain settings of the ADC circuits and phases of the timing signals have been adjusted to desired settings and phases, respectively.

4. The integrated circuit device of claim 1 wherein the calibration signal constitutes at least part of the input signal to the ADC circuits throughout the time interval over which the ADC circuits are enabled to generate respective digital representations of the input signal.

5. The integrated circuit device of claim 1 wherein the calibration signal generator comprises a sinusoidal signal generator and the calibration signal comprises at least one sinusoidal signal.

6. The integrated circuit device of claim 1 wherein the calibration signal is a pseudo-noise calibration signal.

7. The integrated circuit device of claim 1 further comprising circuitry, coupled to the calibration signal generator, to at least temporarily combine the calibration signal with a signal of interest to generate the input signal.

8. The integrated circuit device of claim 7 wherein the circuitry to at least temporarily combine the calibration signal with the signal of interest comprises a summing circuit to at least temporarily sum the calibration signal with the signal of interest.

9. The integrated circuit device of claim 1 further comprising circuitry, coupled to the calibration signal generator, to continuously combine the calibration signal with a signal of interest to generate the input signal.

10. The integrated circuit device of claim 1 wherein the timing signals are periodic signals each having the same frequency.

11. The integrated circuit device of claim 10 wherein the calibration signal has a frequency harmonically related to the frequency of the timing signals.

12. The integrated circuit device of claim 10 wherein the calibration signal has a frequency that is a fraction of the frequency of the timing signals.

13. The integrated circuit device of claim 1 wherein the correction circuitry comprises circuitry to adjust the gain settings of the ADC circuits based on gain variations of the ADC circuits indicated by the FFTs.

14. The integrated circuit device of claim 1 wherein the timing signal generator comprises a timing correction input to receive a plurality of timing control values from the correction circuitry, each timing control value to control a phase angle of a corresponding one of the timing signals, and wherein the correction circuitry comprises circuitry to adjust the timing control values based on phase variations indicated by the FFTs.

15. A method of operation within an integrated circuit device, the method comprising:
- generating a plurality of digital representations of an input signal in a plurality of analog-to-digital converter (ADC) circuits in response to respective timing signals that are offset in phase from one another, each ADC circuit having a gain setting that controls a magnitude of the digital representation;
- generating a calibration signal that constitutes at least part of the input signal during at least part of a time interval over which the digital representations of the input signal are generated;
- generating a plurality of fast-Fourier transforms (FFTs) that correspond to the digital representations; and
- adjusting the gain settings of the ADC circuits and phases of the timing signals based at least in part on the FFTs.

16. The method of claim 15 wherein generating a calibration signal that constitutes at least part of the input signal comprises providing the calibration signal when the integrated circuit device is initially powered on.

17. The method of claim 16 further including disabling the calibration signal after the gain settings of the ADC circuits and phases of the timing signals have been adjusted to desired settings and phases, respectively.

18. The method of claim 16 further including terminating providing the calibration signal as at least part of the input signal after completing calibration of the ADC circuits.

19. The method of claim 15 wherein generating a calibration signal that constitutes at least part of the input signal comprises continuously providing the calibration signal as at least part of the input signal.

20. The method of claim 15 wherein generating a calibration signal comprises generating at least one sinusoidal signal.

21. The method of claim 15 wherein generating a calibration signal comprises generating a pseudo-noise calibration signal.

22. The method of claim 15 further comprising at least temporarily combining the calibration signal with a signal of interest to generate the input signal.

23. The method of claim 15 wherein generating the calibration signal comprises generating a calibration signal having a frequency harmonically related to a frequency of the timing signals.

24. The method of claim 15 wherein generating the calibration signal comprises generating a calibration signal having a frequency that is a fraction of a frequency of the timing signals.

25. The method of claim 15 wherein adjusting the gain settings of the ADC circuits and phases of the timing signals based at least in part on the FFTs comprises:
- adjusting the gain settings based on differences in the magnitudes of the digital representations indicated by the FFTs; and
- adjusting phases of the timing signals based on phase variations indicated by the FFTs.

26. An integrated circuit device comprising:
- a plurality of analog to digital converter (ADC) circuits to generate respective digital representations of an input signal in response to respective timing signals that are offset in phase from one another, each ADC circuit having a gain setting that controls a magnitude of the digital representations;
- a calibration signal generator to generate a calibration signal that constitutes at least part of the input signal during at least part of a time interval over which the digital representations of the input signal are generated;
- means for generating a plurality of fast-Fourier transforms (FFTs) that correspond to the digital representations; and
- means for adjusting the gain settings of the ADC circuits and phases of the timing signals based at least in part on the FFTs.

* * * * *